(12) United States Patent
Canumalla et al.

(10) Patent No.: US 9,577,406 B2
(45) Date of Patent: Feb. 21, 2017

(54) EDGE-EMITTING LASER DIODE PACKAGE COMPRISING HEAT SPREADER

(71) Applicant: MICROSOFT TECHNOLOGY LICENSING, LLC, Redmond, WA (US)

(72) Inventors: Sridhar Canumalla, Sammamish, WA (US); Ketan R. Shah, Olympia, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 125 days.

(21) Appl. No.: 14/318,172

(22) Filed: Jun. 27, 2014

(65) Prior Publication Data
US 2015/0380897 A1   Dec. 31, 2015

(51) Int. Cl.
*H01L 23/48*   (2006.01)
*H01L 23/10*   (2006.01)
(Continued)

(52) U.S. Cl.
CPC .......... *H01S 5/02476* (2013.01); *G01B 11/22* (2013.01); *H01S 5/02248* (2013.01); *H01S 5/4031* (2013.01); *H04N 5/2251* (2013.01); *H04N 5/2256* (2013.01); *H01L 33/642* (2013.01); *H01S 5/022* (2013.01); *H01S 5/02469* (2013.01)

(58) Field of Classification Search
CPC ... H01L 25/0753; H01L 33/62; H01L 33/642; H01L 27/153; H01L 25/075; H01L 27/15; H01L 33/08; H01L 33/00
See application file for complete search history.

(56) References Cited

U.S. PATENT DOCUMENTS 3,694,902 A   10/1972   Apgar et al.
4,752,109 A   6/1988   Gordon et al.
(Continued)

FOREIGN PATENT DOCUMENTS

EP   2610978 A2   7/2013
FR   2106074 A5   4/1972
(Continued)

OTHER PUBLICATIONS

Jiang, et al., "Understanding of Laser, Laser diodes, Laser diode packaging and its relationship to Tungsten Copper", In Proceedings of Advanced Thermal Management Materials, Sep. 7, 2012, 18 pages.
(Continued)

*Primary Examiner* — Thomas L Dickey
*Assistant Examiner* — Damon Hillman
(74) *Attorney, Agent, or Firm* — Gregg Wisdom; Judy Yee; Micky Minhas

(57) ABSTRACT

Various implementations relating to an illumination package including an edge-emitting laser diode (EELD) are disclosed. In one embodiment, an illumination package includes a heat spreader including a base and a stub that extends from the base, an EELD configured to generate illumination light, the EELD being mounted to a side surface of the stub, and a substrate coupled to the base at a location spaced from the EELD, the substrate being electrically connected to the EELD.

20 Claims, 6 Drawing Sheets

(51) Int. Cl.

| | |
|---|---|
| H01L 23/34 | (2006.01) |
| H01S 5/024 | (2006.01) |
| G01B 11/22 | (2006.01) |
| H01S 5/40 | (2006.01) |
| H04N 5/225 | (2006.01) |
| H01S 5/022 | (2006.01) |
| H01L 33/64 | (2010.01) |

(56) References Cited

U.S. PATENT DOCUMENTS

| | | | |
|---|---|---|---|
| 4,901,324 | A | 2/1990 | Martin |
| 6,285,476 | B1 | 9/2001 | Carlson et al. |
| 6,469,381 | B1* | 10/2002 | Houle ............... H01L 21/4882 257/704 |
| 7,158,549 | B2* | 1/2007 | Ayliffe ............... G02B 6/4201 257/750 |
| 7,235,880 | B2 | 6/2007 | Prokofiev |
| 8,034,645 | B2 | 10/2011 | Lin et al. |
| 8,188,488 | B2 | 5/2012 | Andrews et al. |
| 8,199,787 | B2 | 6/2012 | Deri et al. |
| 8,201,968 | B2 | 6/2012 | Maxik et al. |
| 8,254,422 | B2 | 8/2012 | Datta et al. |
| 8,320,621 | B2 | 11/2012 | McEldowney |
| 9,072,533 | B2* | 7/2015 | Liu ..................... A61B 18/203 |
| 2002/0030445 | A1 | 3/2002 | Fukasawa |
| 2002/0100912 | A1 | 8/2002 | Ishiguro et al. |
| 2003/0159844 | A1 | 8/2003 | Wolf et al. |
| 2004/0031272 | A1 | 2/2004 | Mecherle et al. |
| 2004/0136099 | A1 | 7/2004 | Kim et al. |
| 2006/0018098 | A1 | 1/2006 | Hill et al. |
| 2006/0088254 | A1 | 4/2006 | Mohammed |
| 2007/0158799 | A1 | 7/2007 | Chiu et al. |
| 2009/0086455 | A1 | 4/2009 | Sakamoto et al. |
| 2009/0116251 | A1 | 5/2009 | Harbers et al. |
| 2010/0096643 | A1 | 4/2010 | Cao |
| 2011/0019416 | A1 | 1/2011 | Poissonnet et al. |
| 2012/0044790 | A1* | 2/2012 | Shimazawa ............ G11B 5/105 369/13.32 |
| 2012/0050991 | A1 | 3/2012 | Tamanuki |
| 2012/0153340 | A1 | 6/2012 | Song et al. |
| 2012/0287958 | A1* | 11/2012 | Lell ....................... H01S 5/4043 372/45.01 |
| 2012/0293625 | A1 | 11/2012 | Schneider et al. |
| 2013/0022069 | A1 | 1/2013 | Lee et al. |
| 2013/0208753 | A1 | 8/2013 | van Leeuwen et al. |
| 2013/0272330 | A1 | 10/2013 | Joseph et al. |

FOREIGN PATENT DOCUMENTS

| | | |
|---|---|---|
| JP | 11185273 A | 7/1999 |
| WO | 2012015724 A1 | 2/2012 |
| WO | 2012154510 A3 | 11/2012 |

OTHER PUBLICATIONS

Mercado, Emmanuel., "Low-Temperature Characterization of a 1.55-μm Multiple-Quantum-Well Laser Down to 10K", In Proceedings of SPIE OPTO. International Society for Optics and Photonics, May 2013, 91 pages.

"Processing and Characterization of Module to Heatspreader Interface", Published on: Jul. 21, 2003 Available at: http://scholar.lib.vt.edu/theses/available/etd-0107100-102125/unrestricted/ch4.pdf.

Johnson, Lawrence A., "Controlling Temperatures of Diode Lasers Thermoelectrically", http://assets.newport.com/webDocuments-EN/images/AN01_Control_Temp_Laser_Diode_IX.PDF, Available as early as Apr. 1988, 11 pages.

"Laser Cooling for TO Packages Using Embedded Thin-Film Thermoelectric Coolers", Nextreme Thermal Solutions, Inc., http://www.nextreme.com/media/pdf/Nextreme_Laser_Diode_Cooling_Test_Report_Jan10.pdf, Jan. 2010, 8 pages.

"Thermoelectric Cooling Systems Design Guide", Marlow Industries, Inc., http://www.marlow.com/media/marlow/images/Downloads/TEC%20Design%20Guide.pdf, Available as early as Jan. 1994, 21 pages.

Seurin, Jean-Francois et al., "Efficient Vertical-Cavity Surface-Emitting Lasers for Infrared Illumination Applications", Proceedings of the SPIE the International Society for Optical Engineering, http://www.princetonoptronics.com/pdfs/7952-15.pdf, Feb. 13, 2011, 10 pages.

Colaco, Andrea et al., "3dim: Compact and Low Power Time-of-Flight Sensor for 3D Capture Using Parametric Signal Processing", MIT, http://www.rle.mit.edu/stir/documents/ColacoKGMWG_IISW2013.pdf, Jun. 15, 2013, 4 pages.

"3DV Systems: ZCam—Depth Camera", Optoelectronic Notes, http://ntuzhchen.blogspot.tw/2011/04/3dv-systems-zcam-depth-camera.html, Apr. 6, 2011, 5 pages.

"Optical Components", Finisar, http://www.finisar.com/products/optical-components/High-Powered-VCSELs/HVS7000-001, Available as early as Feb. 24, 2013, 1 pages.

Pritsch, Benedikt et al., "High-Power IR Laser in SMT Package", Proceedings of the SPIE 2009, vol. 7198, International Society for Optics and Photonics, http://144.206.159.178/ft/CONF/16426345/16426360.pdf. Feb. 23, 2009, 9 pages.

Bovatsek, Jim et al., "Ultraviolet Lasers: UV Lasers Improve PCB Manufacturing Processes", LaserFocusWorld, International Resource for Technology and Applications in the Global Photonics Industry, http://www.laserfocusworld.com/articles/print/volume-48/issue-11/features/uv-lasers-improve-pcb-manufacturing-processes.html, Nov. 1, 2012, 6 pages.

Canumalla, Sridhar, "Thermal Management in Laser Diode Device", U.S. Appl. No. 13/758,804, filed Feb. 4, 2013, 27 pages.

Masalkar, Prafulla, "VCSEL Array for a Depth Camera", U.S. Appl. No. 14/177,157, filed Feb. 10, 2014, 29 pages.

ISA European Patent Office, International Search Report and Written Opinion for International Patent Application No. PCT/US2014/013467, Apr. 28, 2014, 14 pages.

IPEA European Patent Office, International Preliminary Report on Patentability of PCT/US2014/013467, Jan. 26, 2015, 16 pages.

ISA European Patent Office, International Search Report and Written Opinion Issued in Application No. PCT/US2015/037556, Aug. 13, 2015, WIPO, 11 pages.

ISA European Patent Office, International Search Report and Written Opinion Issued in Application No. PCT/US2015/014343, Sep. 22, 2015, WIPO, 15 pages.

IPEA European Patent Office, Second Written Opinion issued in PCT Application No. PCT/US2015/037556, May 12, 2016, WIPO, 5 pages.

IPEA European Patent Office, International Preliminary Report on Patentability Issued in Application No. PCT/US2015/014343, Dec. 23, 2015, WIPO, 7 pages.

IPEA European Patent Office, International Preliminary Report on Patentability Issued in PCT Application No. PCT/US2015/037556, Aug. 4, 2016, WIPO, 11 pages.

* cited by examiner

EDGE-EMITTING LASER DIODE PACKAGE COMPRISING HEAT SPREADER

BACKGROUND

An edge-emitting laser diode (EELD) may be implemented in various illumination devices to provide high peak power and a fast modulation speed with sharp edge definition. An EELD propagates light in a direction parallel to a surface of a semiconductor chip used to form the EELD, and emits the light at a cleaved edge of the chip.

SUMMARY

Various embodiments relating to an illumination package including an edge-emitting laser diode (EELD) are disclosed. In one embodiment, an illumination package includes a heat spreader including a base and a stub that extends from the base. The illumination package further includes an EELD configured to generate illumination light. The EELD is mounted to a side of the stub. The illumination package further includes a substrate coupled to the base at a location spaced from the EELD. The substrate is electrically connected to the EELD.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

As mentioned above, an edge-emitting laser diode (EELD) may be implemented in various illumination devices to provide high peak power and a fast modulation speed with sharp edge definition. In particular, the high peak power of the EELD may provide enough light to illuminate an environment for imaging purposes. Furthermore, the fast modulation speed with sharp edge definition may provide accurate measurements of light returned from the environment when the EELD is implemented in a time-of-flight (TOF) depth camera, for example.

An EELD may be packaged in a steel container that couples to a front surface of a printed circuit board (PCB). However, as the PCB is a poor thermal conductor, a thermal coupler surrounding the EELD package may be used to dissipate heat from the EELD to a heat sink positioned on a rear surface of the PCB. Thus, the heat dissipation path flows from the EELD package, through the thermal coupler, and around the front surface of the PCB in order to reach the heat sink on the rear surface of the PCB. This long heat dissipation path may translate into a substantial temperature difference between the heat sink and a laser junction of the EELD (e.g., 15-20 degrees C.).

In such an implementation, a driver circuit may be coupled intermediate the rear surface of the PCB and the heat sink. Such positioning of the driver circuit may allow for a direct heat dissipation path from the driver circuit to the heat sink. However, as the driver circuit is separated from the EELD package by the PCB, the resulting connection distance may lead to high electrical inductance.

Additionally, the metal-to-metal interface between the steel can of the EELD package and the thermal coupler may act as an antenna that radiates emissions during operation of the EELD. The illumination device may be fitted with shielding to absorb the radiated emissions. However, such shielding may add cost to the illumination device.

Accordingly, examples are disclosed herein that relate to illumination packages including an EELD that may be implemented in various illumination devices. More particularly, the disclosed implementations of illumination packages may be configured to dissipate heat from the EELD more efficiently than the package described above. Furthermore, in some implementations, the illumination package may provide an electrical signal with lower inductance relative to the current package. Additionally, in some implementations, the illumination package may have lower radiated emissions relative to the current package that allows for shielding to be omitted from an illumination device that implements this illumination package. As such, a cost of the illumination device that implements this illumination package may be less than a cost of an illumination device that uses the current package.

Figure 1:
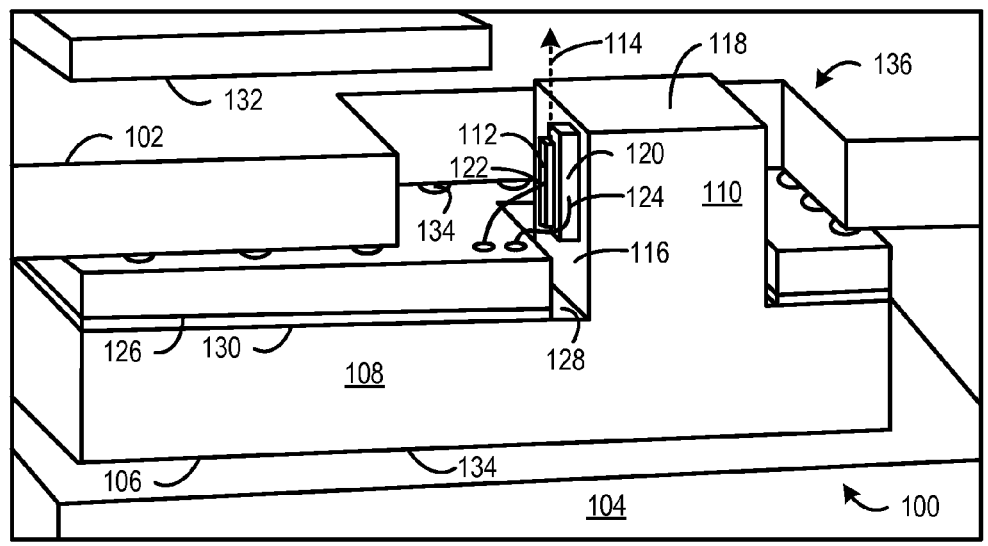
FIG. 1 shows an example illumination package including an edge-emitting laser diode (EELD).

FIG. 1 shows an example illumination package 100 that may be implemented in an illumination device. The illumination package 100 may be positioned between a PCB 102 and a heat sink 104. The illumination package 100 includes a heat spreader 106 having a base 108 and a stub 110 that extends from the base. Further, an EELD 112 is mounted to a side of the stub 110. In the depicted example, the EELD 112 is mounted to the side 116 of the stub 110 so that the illumination light 114 is emitted from the EELD in a direction that is perpendicular to a bottom plane of the base 108. However, the EELD may be mounted to emit light in any other suitable direction.

In some implementations, the EELD 112 may emit illumination light directly to the environment without using additional optics to direct the illumination light. Likewise, in some implementations, the illumination light emitted from the EELD may be directed by optics to the environment. For example, the EELD may be mounted to a top surface 118 of the stub that is parallel with the base 108, and optics may be positioned to turn the illumination light towards the environment.

In some implementations, the EELD 112 may be mounted directly to the side 116 of the stub 110. Further, in some implementations, the EELD 112 may be mounted to a submount 120, and the submount may be coupled to the side 116 of the stub 110. The submount 120 may facilitate surface mounting of the EELD on the stub 110 of the heat spreader 106. For example, the submount 120 may have a coefficient of thermal expansion (CTE) that matches the EELD 112 to help reduce material interface stresses. The submount 120 may be made of any suitable thermally conductive material to disperse heat away from the EELD in order to promote lower operating temperatures. In one non-limiting example, the EELD may be formed at least partially from gallium arsenide, the submount may be formed at least partially from aluminum nitride, and the heat spreader may be formed at least partially from copper. Other non-limiting examples of materials used in the EELD, the submount, and/or the heat spreader include, but are not limited to, gallium arsenide, aluminum nitride, silicon, copper, and copper alloy(s).

The EELD 112 includes an anode 122 and a cathode 124 that provide an electrical connection to a substrate 126. In some implementations, the anode and/or the cathode may be positioned on the submount 120 (when included). For example, the electrodes and/or the top surface of the submount may be metalized in order to electrically connect with the EELD. In particular, the EELD 112 may be bonded to the cathode 124, for example via a bonding process. Further, the EELD may be electrically connected to the anode 122, and in some examples may utilize a plurality of bonding wires.

The substrate 126 may be electrically connected to the anode 122 and the cathode 124 of the EELD 112 to provide a metalized electrical connection between the EELD 112 and control circuitry of the PCB 102 and a driver circuit 132. The substrate may be electrically connected to the anode and the cathode in any suitable manner. For example, a plurality of conductive metal (e.g., gold) leads may be connected between the substrate and the anode and the cathode, respectively. In one particular example, the substrate may be connected to the anode via two leads and the substrate may be connected to the cathode via four leads. The use of multiple leads may help to reduce inductive losses in the electrical signal provided to the EELD relative to a configuration that employs single lead connections.

The substrate 126 may be coupled to the base 108 at a location spaced from the EELD 112. As one example, the substrate 126 may be coupled to a top surface 128 of the base 108 of the heat spreader 106 via a thermal interface material 130. The substrate may be located on the base of heat spreader in various configurations relative to the stub and the EELD as will be discussed in further detail below with reference to FIGS. 3 and 4. The term "top surface" as used above refers to the device when in the orientation of FIGS. 1 and 2, and is not intended to imply that the device has any particular orientation when in use.

Continuing with FIG. 1, the heat sink 104 is depicted as being coupled directly to the illumination package 100 via a bottom surface 134 (with reference to the orientation of FIG. 1) of the base 108 of the heat spreader 106. The thermal interface between the heat spreader and the heat sink may allow for a short, direct heat dispersion path from the EELD to the heat sink. Such a configuration may provide more efficient heat dissipation relative to a configuration in which heat is dissipated through a thermal couple that wraps around a PCB to couple to a heat sink.

The illumination package 100 may be coupled to the PCB 102 via a plurality of solder pads 135. The plurality of solder pads 135 may be used to electrically connect the PCB 102 to the EELD 112 and/or physically connect the PCB to the substrate. In the example of FIG. 1, the plurality of solder pads 135 are coupled between the substrate 126 and the PCB 102, such that the illumination package is positioned between the PCB and the heat sink. In such a configuration, the EELD may emit a beam of illumination light 114 through an opening 136 that extends through the PCB 102 to illuminate the surrounding environment. In other examples, the stub 110 may be positioned adjacent an edge of the PCB 102 such that the illumination light is emitted beyond the edge of the PCB 102. In such examples, the opening 136 in the PCB 102 may be omitted.

The driver circuit 132 may be mounted to the PCB 102 and electrically connected to the illumination package 100 through the PCB 102. In one example, the EELD 112 is made of gallium arsenide and the driver circuit is made of silicon. The driver circuit 132 may be configured to deliver an operating current to the EELD 112 to power the EELD. In particular, the driver circuit 132 may be configured to receive a modulated input signal from control circuitry of the PCB 102. The driver circuit 132 may act as a current source to deliver the modulated input signal to the EELD 112. For example, the EELD 112 may generate illumination light as a pulse train that corresponds to the modulated input signal. The EELD may generate illumination light at any suitable modulation speed and/or frequency without departing from the scope of this disclosure.

Figure 2:
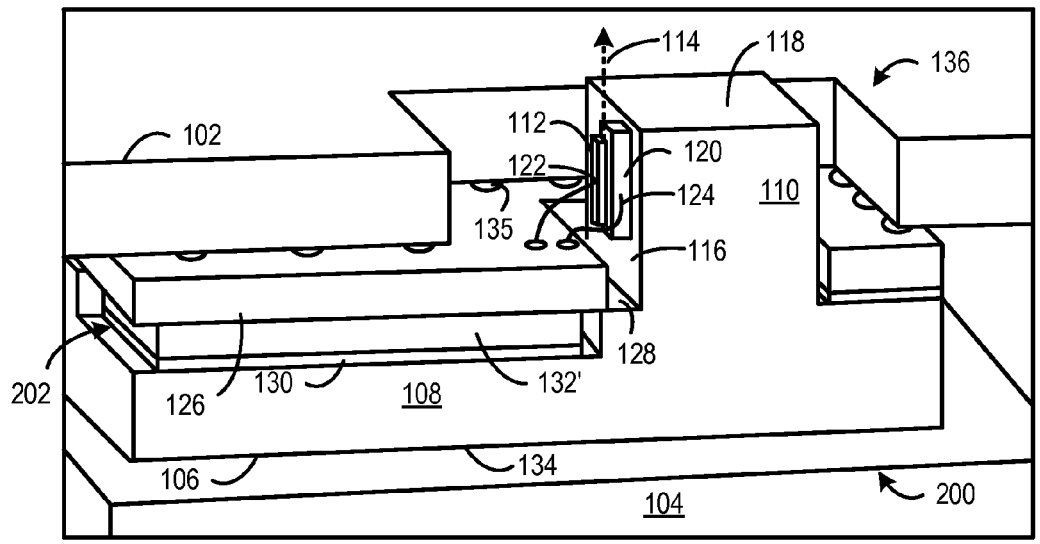
FIG. 2 shows another example illumination package including an EELD.

FIG. 2 shows another example illumination package 200. Components of the illumination package 100 that correspond to those of the illumination package 200 are identified in the same way and are not described in detail. The illumination package 200 differs from the illumination package 100 in that the driver circuit 132' is included in the illumination package 200 and coupled directly to the heat spreader 106. The base 108 may include a cutout 202 in the top surface 128 to spatially accommodate the driver circuit 132', such that the driver circuit is positioned between the substrate 126 and the base 108. As such, the driver circuit 132' may be configured to deliver an operating current to the EELD 112 via the substrate 126. In this implementation, the driver circuit may have a direct heat dissipation path to the heat sink and a delivery signal path to the EELD that does not go through the PCB.

Figure 3:
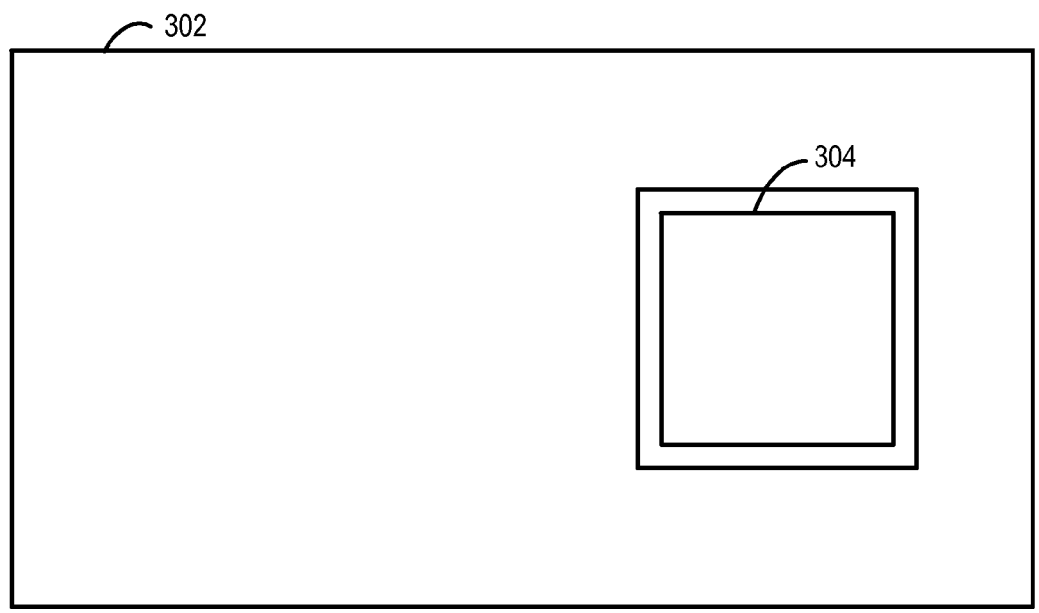
FIG. 3 shows an example substrate surrounding a stub of a heat spreader.
Figure 4:
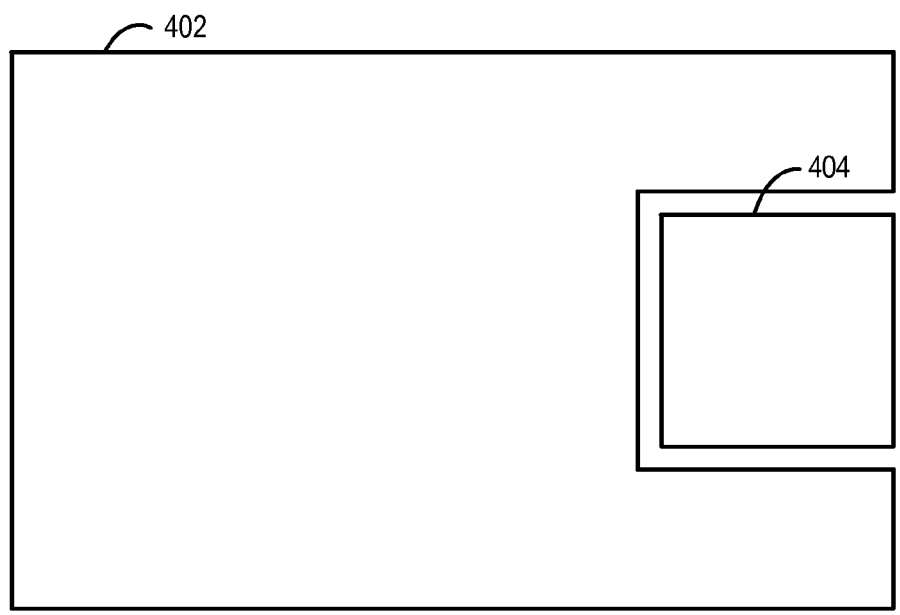
FIG. 4 shows another example substrate adjacent a stub of a heat spreader.

FIGS. 3 and 4 schematically example configurations of a substrate positioned relative to a stub of a heat spreader in an illumination package. Each figure shows a cross-section in a plane that includes the substrate and the stub protruding from the base of the heat spreader. In one example shown in FIG. 3, the substrate 302 extends around the stub in the plane. In particular, the substrate 302 may surround the stub 304 on all four sides of the stub in the plane. In another example shown in FIG. 4, the substrate 402 is positioned adjacent the stub 404 such that the substrate partially surrounds the stub. In some implementations, the substrate may be adjacent just one side of the stub. In some implementations, the substrate may be adjacent two or more sides of the stub. It will be understood that the substrate may have any suitable position on the base of the heat spreader relative to the stub without departing from the scope of the present disclosure.

Figure 5:
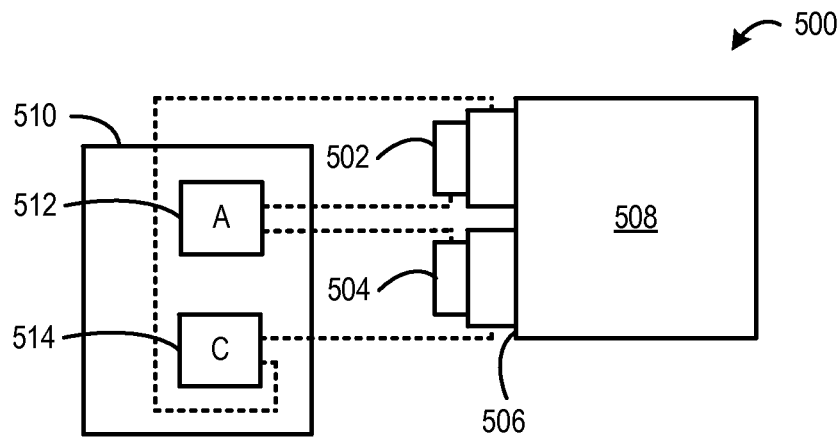
FIG. 5 shows an example illumination package including a plurality of EELDs mounted on a same side of a stub of a heat spreader.
Figure 6:
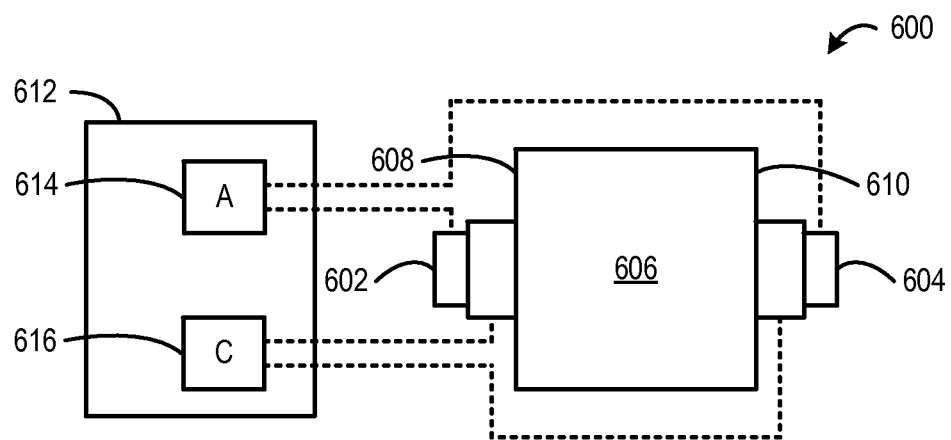
FIG. 6 shows another example illumination package including a plurality of EELDs mounted on opposing sides of a stub of a heat spreader.

In some implementations, the illumination package may include a plurality of EELDs. Such implementations may be applicable to environments in which illumination light is emitted over long distances and/or used to illuminate large spaces. FIGS. 5 and 6 show different example mounting configurations for a plurality of EELDs in an illumination package. In the example of FIG. 5, an illumination package 500 includes a first EELD 502 and a second EELD 504 both mounted to a same side 506 of a stub 508. The first EELD 502 and the second EELD 504 may be electrically connected in parallel to a substrate 510. Further, the first EELD 502 and the second EELD 504 may have a common anode 512 and cathode 514, as depicted in FIG. 5, or may have any other suitable electrical connectivity.

In the example of FIG. 6, an illumination package 600 includes a first EELD 602 and a second EELD 604 mounted on opposing sides of a stub 606 of a heat spreader. In this example, the first EELD 602 is mounted to a first side 608 of a heat spreader stub having a rectangular cross section, and the second EELD 604 is mounted to a second side 610 that opposes the first side. However, it will be understood that the first and second EELDs may be mounted to any suitable sides of a stub having any suitable cross sectional shape. As with the example, of FIG. 6, the first EELD 602 and the second EELD 604 may be electrically connected in parallel to a substrate 612, and thus may share a common anode 614 and cathode 616, or may have any other suitable electrical connectivity.

In some implementations, EELDs may be selected for a multiple EELD package configuration based on power characteristics determined based on data collected for each diode at the wafer level during manufacturing. For example, diodes may be selected based on being from the same wafer, from a neighboring location on different wafers, or based upon any other suitable diode electrical relationship. Further, in some implementations, the EELDs may be selected to have similar electrical current or inductance characteristics. Additionally, in some implementations, the EELDs may be selected to have opposing inductance characteristics that average out to a suitable inductance level. By matching the EELDs used in an illumination package, similar optical light and pulsing characteristics may be attained as desired.

In some implementations, the multiple EELD configurations described in FIGS. 5 and 6 may be employed in the illumination packages shown in FIGS. 1 and 2. Further, in some implementations, the multiple EELD configurations described in FIGS. 5 and 6 may be employed in a traditional package in which the multiple EELDs are contained in a metal can or other such packaging.

Figure 7:
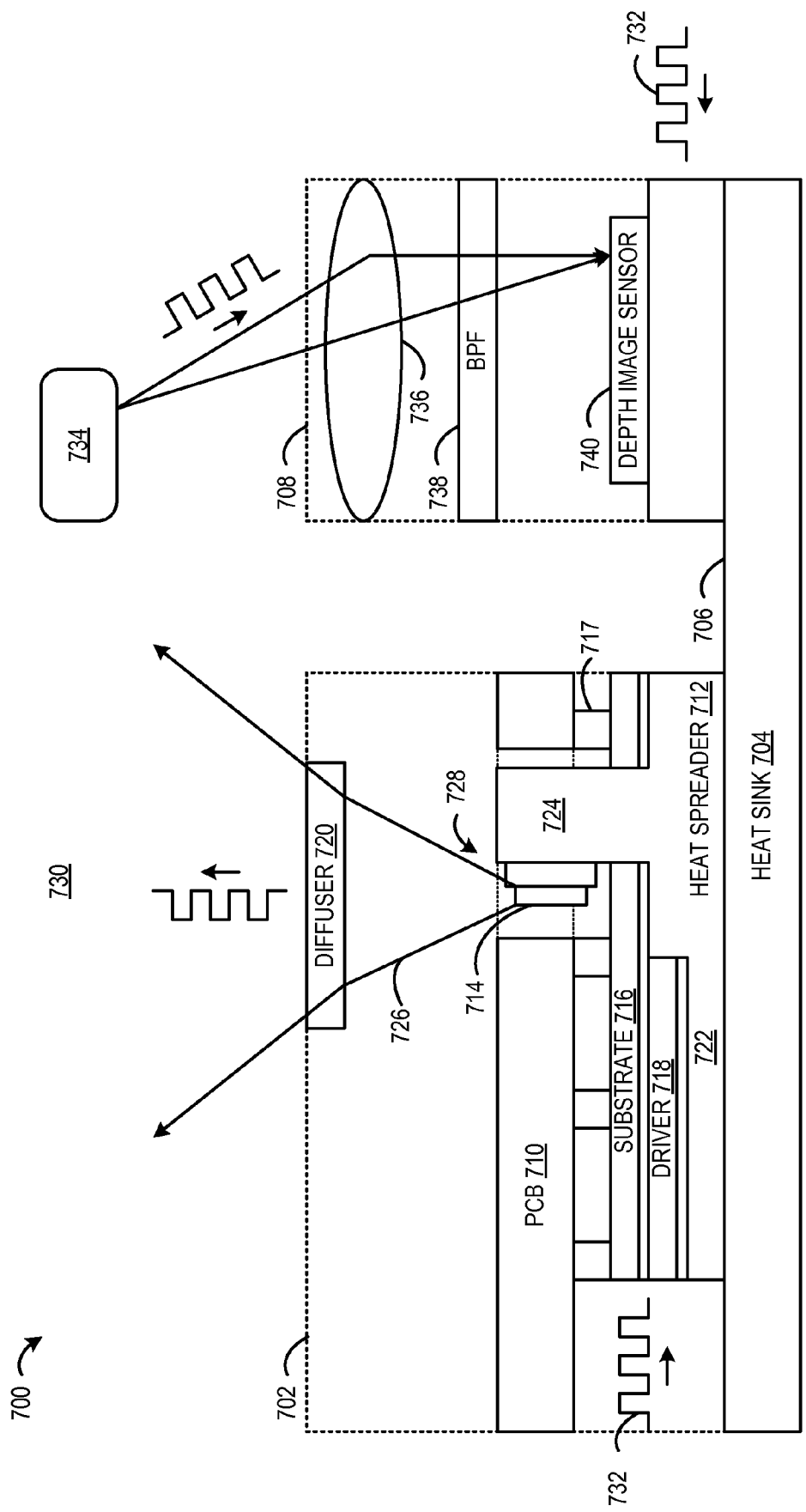
FIG. 7 shows an example time-of-flight (TOF) depth camera.

FIG. 7 schematically shows an example time-of-flight (TOF) depth camera 700 in which an illumination package 702 may be implemented as a light source. The TOF depth camera may be configured to collect image data from an image environment illuminated by illumination light emitted by the illumination package 702. The TOF depth camera 700 includes a heat sink 704 having a mounting surface 706. The illumination package 702 and a depth sensor module 708 may be mounted to the mounting surface 706 of the heat sink 704. The illumination package 702 may be spaced away from the depth sensor module 708 on the mounting surface 706 to allow for air flow between the modules in order to dissipate heat from the modules to the heat sink 704. Moreover, the illumination package 702 may be spaced a suitable distance away from the depth sensor module 708 on the mounting surface to inhibit stray light from leaking from the illumination package to the depth sensor module. In some implementations, a barrier may be positioned between the illumination package and the depth sensor module to prevent stray light from interfering with the depth sensor module.

The illumination package 702 includes a PCB 710, a heat spreader 712, an EELD 714, a substrate 716, a driver circuit 718, and a diffuser 720. The heat spreader 712 may include a base 722 and a stub 724 that extends from the base. The base 722 may be coupled directly to the heat sink 704, and positioned intermediate the heat sink and the PCB 710. The EELD 714 may be mounted to the stub 724, and may be configured to emit illumination light 726 through an opening 728 that extends through the PCB 710 and into an environment 730.

The driver circuit 718 may be mounted to the base 722 of the heat spreader and positioned intermediate the base and the substrate 716. The driver circuit 718 may be electrically connected to the EELD 714 via the substrate 716. By mounting the driver circuit directly on the base of the heat spreader, a distance between the driver circuit and the EELD may be reduced relative to a configuration where a driver circuit is mounted on the PCB. Accordingly, an inductance of the electrical signal provided by the driver circuit may be reduced relative to the configuration where the driver circuit is mounted separately. Moreover, the direct thermal connection with the heat spreader may provide more efficient heat transfer relative to a configuration in which the driver circuit is mounted on the PCB.

The driver circuit 718 may be configured to deliver an operating current to the EELD 714 to power the EELD. In particular, the driver circuit 718 may be configured to receive a modulated input signal 732, and may act as a current source to deliver the modulated input signal to the EELD 714. For example, the EELD 714 may emit illumination light as a pulse train that corresponds to the modulated input signal. The EELD may generate illumination light at any suitable modulation speed without departing from the scope of this disclosure.

The substrate 716 may be coupled to the PCB 710 via a plurality of soldering pads 717. The plurality of soldering pads 717 may provide a mechanical coupling as well as an electrical coupling between the substrate 716 and the PCB 710.

The EELD 714 may emit a coherent illumination light beam toward the diffuser 720 of the illumination package 702, and the diffuser may diffuse the light for provision to the environment 730. The diffuser 720 spreads illumination light throughout the environment to make efficient use of the optical power of the EELD 714. The coherent light provided by the EELD may have suitable illumination homogenization characteristics (e.g., speckle suppression, reduction of diffraction artifacts and Moiré fringes as well) that may simplify illumination optics designs (e.g., diffuser 720) for producing diffuse light to illuminate the environment 730.

Light provided to the environment 730 by the illumination package 702 may be reflected off objects in the environment, such as an object 734. The depth sensor module 708 may be configured to receive light returned from the environment 730 including light reflected off of the object 734. The depth sensor module 708 includes one or more lenses 736, a band-pass filter (BPF) 738, and an image sensor 740. The one or more lenses 736 may be configured to direct the returned light through the band-pass filter 738 and to the image sensor 740. The image sensor 740 may be mounted to the heat sink 704. The image sensor 740 may be configured to detect at least a portion of illumination light reflected from the environment. In particular, each sensor pixel may act as a ranging unit by mixing the incoming light (e.g., mainly modulated laser light reflected from the environment) generated signal at the pixel with the modulated input signal 732, yielding information of phase shift (or time delay) of reflected light, and therefore the distance from the image sensor 740 to the object 734 in the environment 730.

Such a configuration may provide a more efficient thermal connection between the heat sink and the EELD relative to a configuration where the EELD is mounted on one side of the PCB and the heat sink is mounted on the other side of the PCB, as heat from the EELD may be transferred to the heat sink without flowing through the PCB or a thermal coupler that wraps around the PCB. Such efficient heat transfer in turn may help to reduce a laser junction temperature, and thus increase an operating efficiency of the EELD relative to designs having less efficient heat transfer to a heat sink. Moreover, such a configuration may allow for flexibility in a layout of the PCB that reduces loop inductance of the EELD. Because heat is not transferred to the heat sink through the PCB, a standard PCB material (e.g., FR4) can be used instead of the more expensive thermally conductive PCB material. For example, the PCB may be made of a material having a thermal conductivity less than 2 Watts/(meters-Kelvin).

Figure 8:
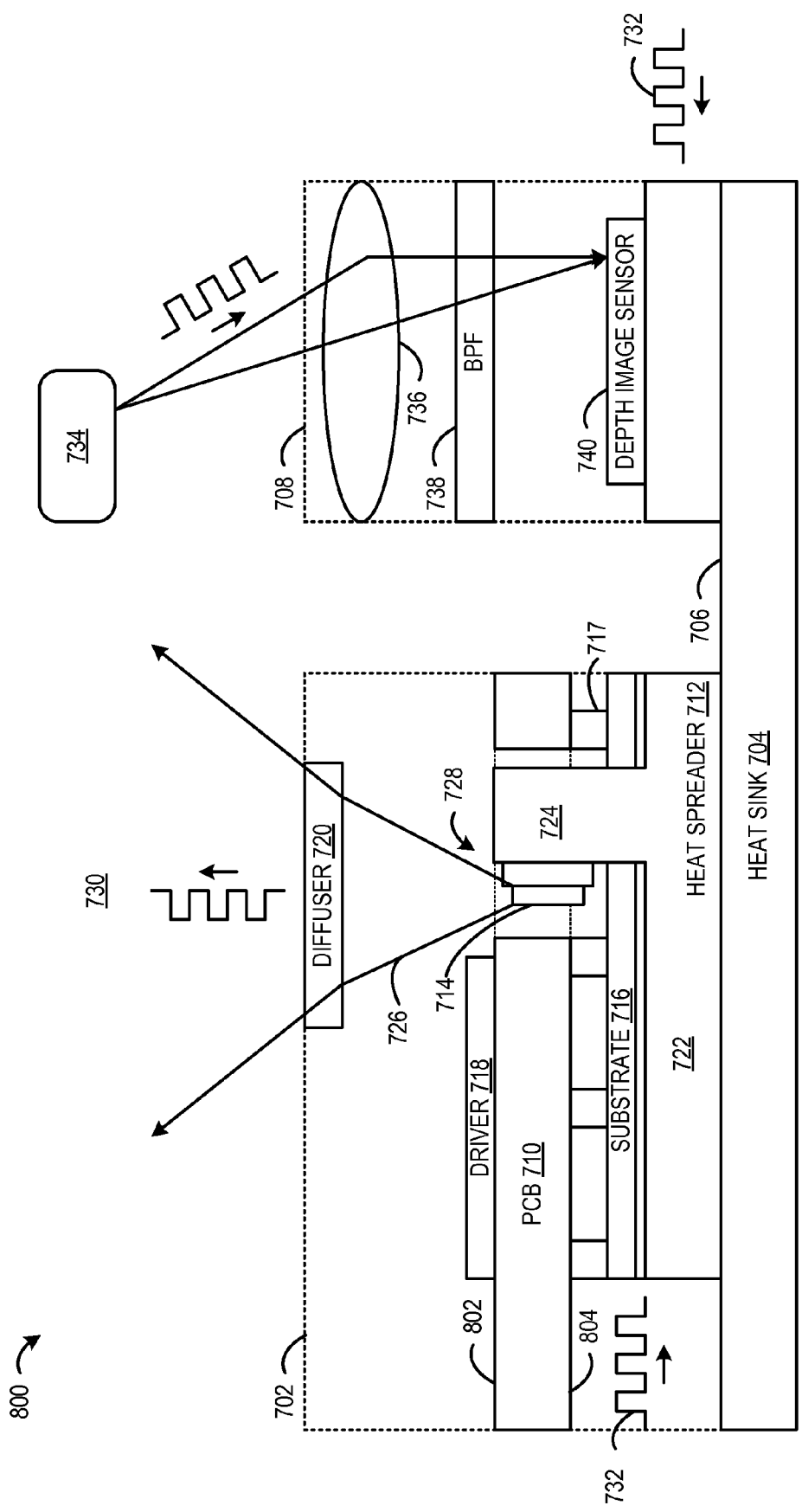
FIG. 8 shows another example TOF depth camera.

FIG. 8 schematically shows another example TOF depth camera 800. Components of the TOF depth camera 800 that may be substantially the same as those of the TOF depth camera 700 are identified in the same way and are described no further. However, it will be noted that components identified in the same way in different implementation of this disclosure may be at least partly different.

The TOF depth camera 800 includes an illumination package 702 where the driver circuit 718 is mounted on the PCB 710. In particular, the PCB 710 has a first side 802 and a second side 804 that opposes the first side. The driver circuit 718 may be mounted to the first side 802 of the PCB 810 and the substrate 716 may be coupled to the second side 804 via the plurality of soldering pads 717. The electrical path between the driver circuit 718 and the EELD 714 may travel through the PCB 710, the plurality of soldering pads 717, and the substrate 716.

This configuration may be used in implementations where the illumination package is modularly constructed without the driver circuit. Such a configuration may provide a lower cost illumination package relative to a configuration that includes the driver circuit. Further, the above described TOF depth cameras may have illumination package that include a plurality of EELDs without departing from the scope of the present disclosure.

Figure 9:
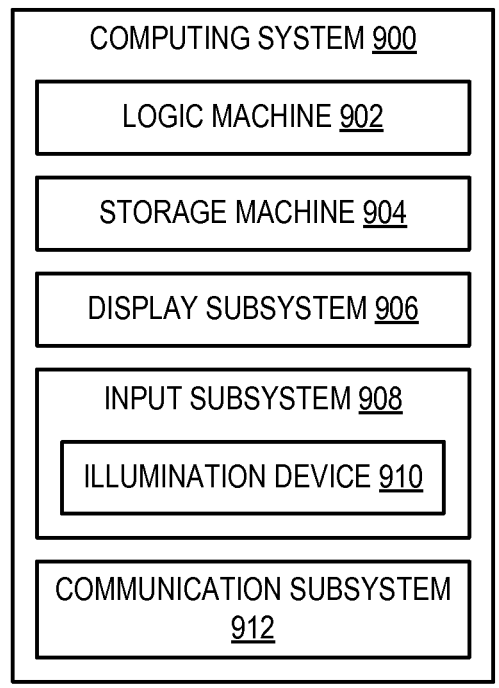
FIG. 9 shows an example computing system in which an illumination package may be implemented.

The implementations described herein may be incorporated into an input subsystem of a computing system. FIG. 9 schematically shows a non-limiting example computing system 900 in which a TOF depth camera (or another illumination device including an illumination package as described above) may be included. Computing system 900 is shown in simplified form. Computing system 900 may take the form of one or more personal computers, server computers, tablet computers, home-entertainment computers, network computing devices, gaming devices, mobile computing devices, mobile communication devices (e.g., smart phone), and/or other computing devices.

Computing system 900 includes a logic machine 902 and a storage machine 904. Computing system 900 may optionally include a display subsystem 906, input subsystem 908 including an illumination device 910, communication subsystem 912, and/or other components not shown in FIG. 9.

Logic machine 902 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 904 includes one or more physical devices configured to hold instructions executable by the logic machine to implement various methods and processes. When such methods and processes are implemented, the state of storage machine 904 may be transformed—e.g., to hold different data.

Storage machine 904 may include removable and/or built-in devices. Storage machine 904 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 904 may include volatile, nonvolatile, dynamic, static, read/write, read-only, random-access, sequential-access, location-addressable, file-addressable, and/or content-addressable devices.

Storage machine 904 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 902 and storage machine 904 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 906 may be used to present a visual representation of data held by storage machine 904. This visual representation may take the form of a graphical user interface (GUI). As the herein described methods and processes change the data held by the storage machine, and thus transform the state of the storage machine, the state of display subsystem 906 may likewise be transformed to visually represent changes in the underlying data. Display subsystem 906 may include one or more display devices utilizing virtually any type of technology. Such display devices may be combined with logic machine 902 and/or storage machine 904 in a shared enclosure, or such display devices may be peripheral display devices.

When included, input subsystem 908 may comprise or interface with one or more user-input devices such as a keyboard, mouse, touch screen, or game controller. In some implementations, the input subsystem may comprise or interface with selected natural user input (NUI) componentry, such as an illumination device 910. In one example, the illumination device 910 is a TOF depth camera as described herein. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 912 may be configured to communicatively couple computing system 900 with one or more other computing devices. Communication subsystem 912 may include wired and/or wireless communication devices compatible with one or more different communication protocols. As non-limiting examples, the communication subsystem may be configured for communication via a wireless telephone network, or a wired or wireless local- or wide-area network. In some implementations, the communication subsystem may allow computing system 900 to send and/or receive messages to and/or from other devices via a network such as the Internet.

The configurations and/or approaches described herein are presented for example, and that these specific implementations or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. An illumination package, comprising:
   a printed circuit board;
   a heat spreader including a base and a stub that extends from the base;
   an edge-emitting laser diode (EELD) configured to generate illumination light, the EELD being mounted to a side of the stub; and
   a substrate coupled between the printed circuit board and the base at a location on the base spaced from the EELD, the substrate being electrically connected to the EELD and the printed circuit board.

2. The illumination package of claim 1, wherein the base includes a mounting surface, wherein the substrate is mounted on the mounting surface, wherein the mounting surface is sized to support at least a majority of the substrate, and further comprising:
   a driver circuit configured to deliver an operating current to the EELD, the driver circuit being coupled to the base and the substrate.

3. The illumination package of claim 1, wherein the EELD is mounted such that the illumination light is emitted from the EELD in a direction that is perpendicular to a plane of the base.

4. The illumination package of claim 1, wherein the substrate partially surrounds the stub.

5. The illumination package of claim 1, wherein the substrate extends around the stub.

6. The illumination package of claim 1, wherein the EELD is a first EELD, and the illumination package further comprises a second EELD mounted to the stub.

7. The illumination package of claim 6, wherein the side is a first side, wherein the stub further includes a second side that opposes the first side, and wherein the second EELD is mounted to the second side.

8. The illumination package of claim 6, wherein the second EELD is electrically connected in parallel with the first EELD.

9. An illumination device comprising:
   a printed circuit board (PCB) including an opening extending through the PCB; and
   an illumination package including,
   a heat spreader including a base and a stub that extends from the base,
   an EELD mounted to a side of the stub and configured to generate illumination light through the opening, and
   a substrate coupled to the base at a location spaced from the EELD, the substrate being electrically connected to an anode and a cathode of the EELD, the substrate including a first surface and a second surface opposing the first surface, the first surface being coupled to the base and a second surface being coupled to the PCB.

10. The illumination device of claim 9, further comprising:
    a driver circuit configured to deliver an operating current to the EELD, the driver circuit being coupled to the substrate and the base.

11. The illumination device of claim 9, wherein the PCB includes a first side and a second side that opposes the first side, wherein the illumination device further comprises a driver circuit coupled to the first side of the PCB, wherein the substrate is coupled to the second side of the PCB, and wherein the driver circuit is configured to deliver an operating current to the EELD through the PCB.

12. The illumination device of claim 9, further comprising a heat sink coupled to the base of the heat spreader, and wherein the heat spreader is positioned intermediate the PCB and the heat sink.

13. The illumination device of claim 9, wherein the substrate extends around the stub.

14. The illumination device of claim 9, wherein the EELD is a first EELD, and the illumination package further comprises a second EELD mounted to the stub.

15. The illumination device of claim 14, wherein the side is a first side, wherein the stub further includes a second side that opposes the first side, and wherein the second EELD is mounted to the second side.

16. The illumination device of claim 14, wherein the second EELD is electrically connected in parallel with the first EELD.

17. A time-of-flight (TOF) depth camera, comprising:
    a heat sink including a mounting surface;
    a printed circuit board (PCB) including an opening extending through the PCB;
    an illumination package including,
    a heat spreader including a base and a stub that extends from the base, the heat spreader being coupled to the mounting surface of the heat sink,
    an edge-emitting laser diode (EELD) mounted to a side of the stub and configured to generate illumination light through the opening and into an image environment, and
    a substrate coupled to the base at a location spaced from the EELD, the substrate being electrically connected to an anode and a cathode of the EELD, the substrate including a first surface and a second surface that opposes the first surface, the first surface being coupled to the base and the second surface being coupled to the PCB; and
    an image sensor coupled to the mounting surface of the heat sink and configured to detect at least a portion of illumination light reflected from the image environment.

18. The TOF depth camera of claim 17, further comprising:

a driver circuit configured to deliver an operating current to the EELD, the driver circuit being coupled to the substrate and the base.

19. The TOF depth camera of claim 17, wherein the EELD is a first EELD, and the illumination package further comprises a second EELD mounted to the stub.

20. The TOF depth camera of claim 19, wherein the second EELD is electrically connected in parallel with the first EELD.

* * * * *